United States Patent
Phan et al.

(10) Patent No.: US 6,759,179 B1
(45) Date of Patent: Jul. 6, 2004

(54) METHODS AND SYSTEMS FOR CONTROLLING RESIST RESIDUE DEFECTS AT GATE LAYER IN A SEMICONDUCTOR DEVICE MANUFACTURING PROCESS

(75) Inventors: Khoi A. Phan, San Jose, CA (US); Jeffrey Erhardt, San Jose, CA (US); Jerry Cheng, Milpistas, CA (US); Richard J. Bartlett, Bonny Doon, CA (US); Anthony P. Coniglio, San Jose, CA (US); Wolfram Grundke, Dresden (DE); Carol M. Bradway, Austin, TX (US); Daniel E. Sutton, Austin, TX (US); Martin Mazur, Pulsnitz (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 84 days.

(21) Appl. No.: 10/050,417

(22) Filed: Jan. 16, 2002

Related U.S. Application Data

(60) Provisional application No. 60/285,197, filed on Apr. 20, 2001.

(51) Int. Cl.$^7$ .............................. G03F 7/20; G03F 7/30; G03F 7/40
(52) U.S. Cl. ...................... 430/311; 430/326; 430/327; 430/329
(58) Field of Search ................................. 430/311, 326, 430/327, 329

(56) References Cited

U.S. PATENT DOCUMENTS 6,649,525 B1 * 11/2003 Phan et al. ................. 438/694

OTHER PUBLICATIONS

"Understanding the DUV Resist Development Process Using A Develop Residue Monitoring Technique". C. Pike and J Erhardt. Presented at Interface 1999; Microlithography Symposium. Nov. 14–16, 1999.
"An Investigation of Circular Resist Residue Defects in the Development of a 0.16μm Flash Process". J. Erhardt, K. Phan, and J. Cheng.

* cited by examiner

Primary Examiner—Mark F. Huff
Assistant Examiner—J. Ruggles
(74) Attorney, Agent, or Firm—Amin & Turocy, LLP

(57) ABSTRACT

Methods and systems are disclosed for reducing resist residue defects in a semiconductor manufacturing process. The methods comprise appropriate adjustment of hardware, substrate, resist, developer, and process variables in order to remove resist residues from a semiconductor substrate structure in order to reduce resist residue defects therein, including special vapor prime and development operations.

14 Claims, 10 Drawing Sheets

METHODS AND SYSTEMS FOR CONTROLLING RESIST RESIDUE DEFECTS AT GATE LAYER IN A SEMICONDUCTOR DEVICE MANUFACTURING PROCESS

CROSS REFERENCE TO RELATED APPLICATIONS

The present application claims the benefit of U.S. Provisional Patent Application Ser. No. 60/285,197, filed Apr. 20, 2001, entitled METHODS AND SYSTEMS FOR CONTROLLING RESIST RESIDUE DEFECTS IN A SEMICONDUCTOR DEVICE MANUFACTURING PROCESS.

FIELD OF THE INVENTION

The present invention relates generally to semiconductor manufacturing processes, and more particularly to methods and apparatus for controlling resist residue defects at Polysilicon Gate layer in a semiconductor device manufacturing process.

BACKGROUND OF THE INVENTION

In the semiconductor industry, there is a continuing trend toward higher device densities. To achieve these high densities there have been and continue to be efforts toward scaling down the device dimensions on semiconductor wafers. In order to accomplish such high device packing densities, smaller and smaller feature sizes are required. The requirement of small features (and close spacing between adjacent features) requires high resolution lithographic processes. In general, lithography refers to processes for pattern transfer between various media It is a technique used for integrated circuit fabrication in which a silicon slice, the wafer, is coated uniformly with a radiation-sensitive film, the photoresist. The photoresist coated substrate is baked to evaporate any solvent in the photoresist composition and to fix the photoresist coating onto the substrate.

The baked coated surface of the substrate is next subjected to selective radiation using a mask, wherein the mask is employed to effect an image-wise exposure to actinic radiation. The masking step is used to protect one area of the wafer while working on another. Alignment apparatus aligns the wafer to the mask, and then projects an intense light through the mask and through a series of reducing lenses, exposing the photoresist with the mask pattern. The mask permits radiation to contact certain areas of the photoresist and prevents radiation from contacting other areas of the photoresist. This selective radiation exposure causes a chemical transformation in the exposed areas of the photoresist coated surface. Types of radiation commonly used in microlithographic processes include visible light, ultraviolet (UV) light, deep ultraviolet (DUV) light and electron beam radiant energy. After selective exposure, the photoresist coated substrate is treated with a developer solution to dissolve and remove either the radiation-exposed or the unexposed areas of the photoresist (depending upon whether a positive or a negative photoresist is utilized) resulting in a patterned or developed photoresist, exposing the underlying layer (e.g., oxide) previously deposited. The portions of the underlying layer not protected by the hardened resist layer may now be etched away, by, for example, a chemical solution or plasma gas discharge, or may otherwise be operated on.

Due to the large number of critical masking steps in a modem process flow and the inherent ability to impact pattern fidelity, photolithographic defects are particularly dangerous. The ability to detect and eliminate new defect types becomes increasingly important as integrated circuit device geometries continue to shrink into the deep submicron regime. Post-develop residue is a common defect phenomenon particularly in DUV lithography which occurs at a critical mask layer. For example, post-develop defects may occur at an active mask layer on a nitride film and/or at a Gate mask on a polysilicon/silicon oxide film or on a silicon nitride BARC (bottom anti-reflective coating) film.

Formation of post-develop or resist residue defects commonly occurs during a pattern image transfer associated with a lithography process. As a result of irradiating a photoresist through a photomask, resist residue or byproducts often form on the photoresist. A developer solution is then deposited over the selectively irradiated photoresist. However, the solubility of the radiation sensitive Photo Acid Generator (PAG) contained in the photoresist can be low. Moreover, it is believed that low solubility rates of the PAG in the developer are exacerbated by the presence of impurities (calcium, sulfur), which cause exposed (open) regions of the resist to be incompletely dissolved in the developer solution within a common process time (typically a 30 to 60 second develop time). As a result, circular defects are generated and remain on the wafer at the completion of the development cycle.

If the resist residue (resist byproducts) contains impurities, such as carbon, calcium (such as in the form of CaF), nitrogen and/or sulfur, the defects become robust enough to withstand decay during a subsequent Barc (bottom anti-reflective coating)/Polysilicon etch process. Hence, poor fidelity of the desired pattern at that layer results (the defects prevent processing of the underlying layer). These post-develop defects tend to have a circular appearance and thus are typically referred to as circular, satellite or cluster defects. Due to their subtle physical characteristics and low density, these defects are often dismissed as non-fatal defects. However, they may contribute to yield loss and raise device reliability issues because of the sheer volume (hundreds to thousands) of such defects on the wafer. In addition, despite their subtle physical characteristics, they can undesirably act as a hard mask, resulting in pattern deformation after etch. Thus, pattern deformation poses a substantial yield risk. In light of these problems, there is an unmet need for detecting, reducing and controlling the presence of post-develop defects at critical mask layers

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the present invention. Rather, the sole purpose of this summary is to present some concepts of the invention in a simplified form as a prelude to the more detailed description that is presented hereinafter. The present invention provides methods and apparatus for controlling resist residue defects in a semiconductor device manufacturing process.

One aspect of the invention provides a method of reducing resist residue defects in a semiconductor manufacturing process, comprising performing a special vapor prime operation to a semiconductor substrate structure, applying a photoresist coat to the semiconductor substrate structure, and selectively exposing a first portion of the photoresist coat using an exposure source and a photomask, wherein a second portion of the photoresist is unexposed. The method further comprises performing a special development operation on the first portion of the photoresist using a developer, removing the developed first portion of the photoresist from the structure, and removing resist residues from the structure in order to reduce resist residue defects. The vapor prime operation comprises priming the structure using an HDMS type priming agent at a temperature from about 85 degrees C. or more to about 130 degrees C. or less for a time period from about 5 seconds or more to about 20 seconds or less.

The development operation comprises dispensing developer onto a semiconductor substrate structure, rinsing front and back sides of the semiconductor substrate structure while spinning the semiconductor substrate structure at a medium speed for a first time period, rinsing the front and back sides of the semiconductor substrate structure while spinning the semiconductor substrate structure at a low speed for a second time period, rinsing the front side of the semiconductor substrate structure for a third time period, and drying the semiconductor substrate structure while spinning the semiconductor substrate structure at a high speed. The development is performed while maintaining a high exhaust air velocity, and may employ extended rinse times, in order to mitigate resist residue defects in the process.

To the accomplishment of the foregoing and related ends, the invention involves the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
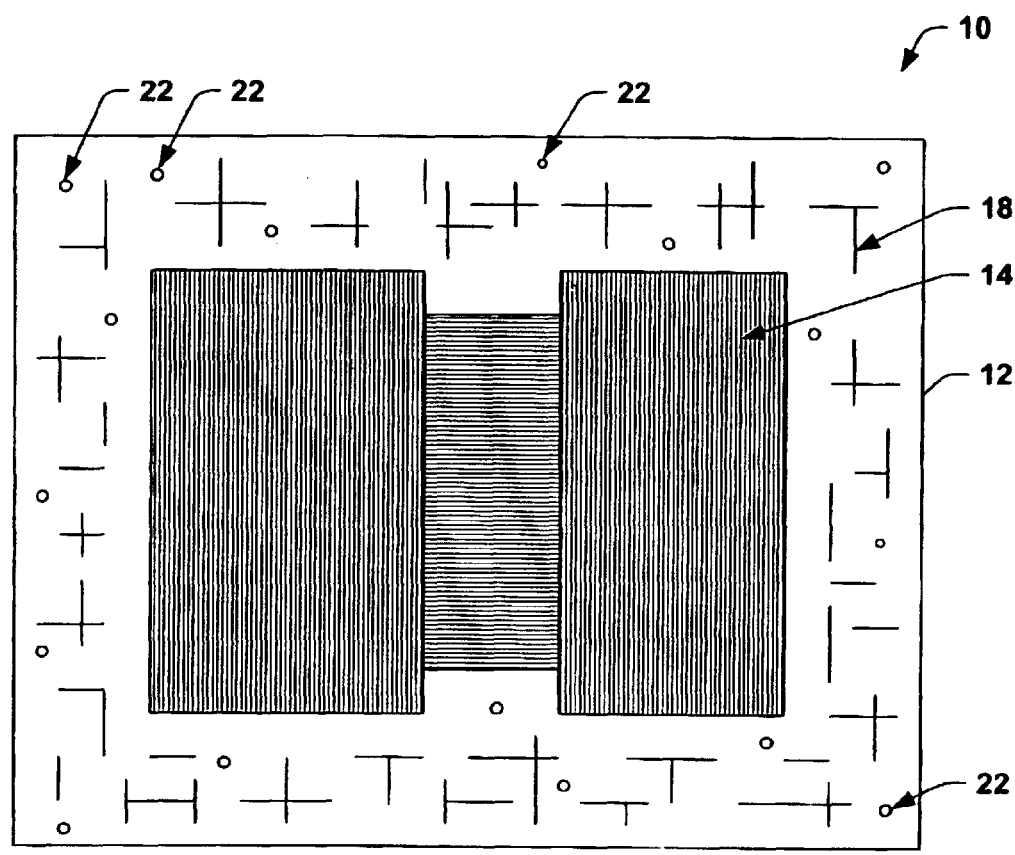
FIG. 1 is a plan view illustrating a photoresist clad wafer patterned by an exemplary mask layout for a memory device demonstrating circular defect distribution on a wafer.

Referring now to the drawings, the various aspects of the invention are illustrated and described hereinafter with respect to several implementations and applications thereof, wherein like numbers are used to indicate like features wherever possible. The invention provides methods and systems for reducing resist residue defects in a semiconductor manufacturing process. Such defects may prevent or inhibit the ability to further process semiconductor structures or wafers after the lithographic operation in which they are created. For instance, such defects, commonly referred to as "cluster" or "satellite" or "circular" defects, may be introduced into a wafer during photoresist development and may cause detectable defects in a structure after poly gate etching.

The inventors of the present invention have found that resist residue defects may include large circular clusters of silicon spires, which range in size from about 3 to 5 microns in diameter. In addition, it was found that product type wafers processed using standard or normal vapor prime and development operations may have these defects in densities between about 40 and 60 defects per square centimeter after poly etch. The cause for these defects has been identified as residing largely in the photolithographic operations. In addition, it has been discovered that these defects include carbon, nitrogen, and sulfur (e.g., commonly associated with photoresist processes), and additionally contained significant amounts of calcium accompanied by fluorine, possibly present as CaF. The calcium content is believed to allow such defects to withstand the rigors of aggressive plasma etch, and hence creates a hard etch mask, which prevents proper processing of the structure where such defects exist. In addition, it is believed that the contamination does not originate in the deionized water (DI) water, but rather the resist/developer is believed to be the source.

Figure 2:
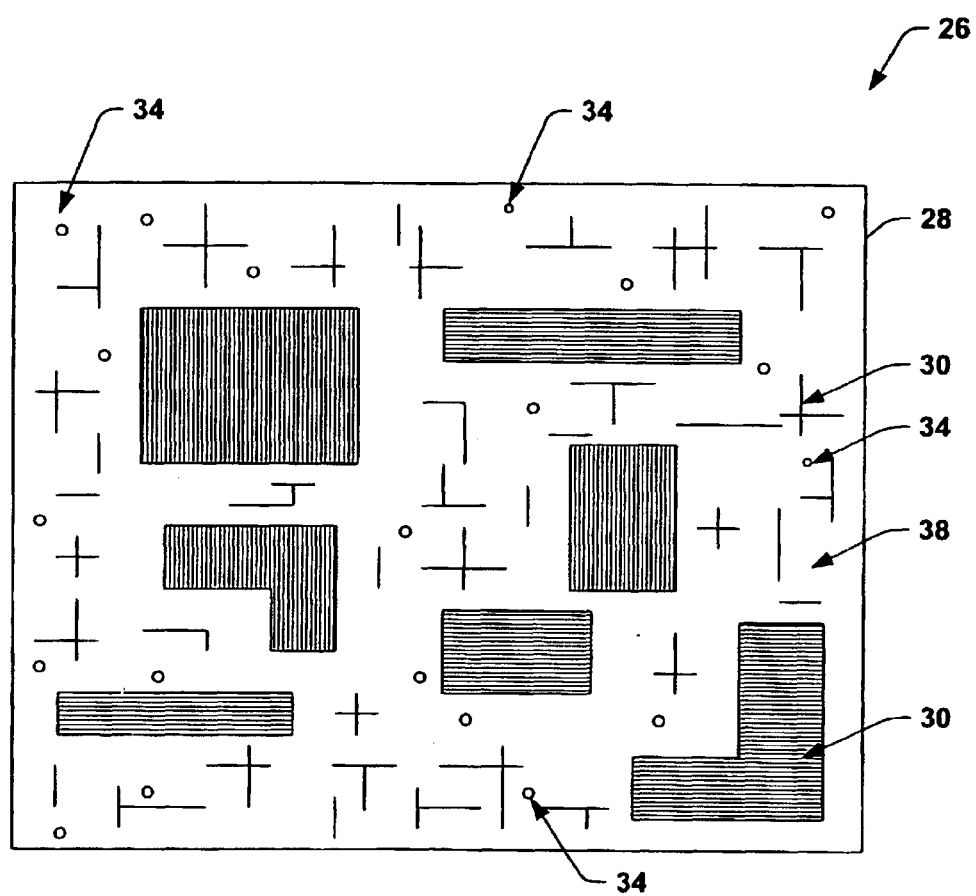
FIG. 2 is a plan view illustrating a photoresist clad wafer patterned by an exemplary mask layout for a logic device demonstrating circular defect distribution on a wafer.

FIGS. 1 and 2 show two common circuit patterns exhibiting this post-develop defect phenomenon. In particular, FIG. 1 illustrates a plan view of a patterned photoresist clad wafer 10. The photoresist 12 has an exemplary layout for a memory device patterned thereon comprising a core circuit 14 and a periphery circuit 18. The circuit patterns 14 and 18 may be formed by a DLV lithography process using a conventional poly gate or circuit mask (not shown). Resist residues (not shown) or resist byproducts of the resist processing are also present on the photoresist before development. After development, post-develop defects 22 undesirably form on the photoresist where they may cause problems.

Post-develop defects 22 primarily tend to appear in the open and/or peripheral areas of the wafer 10, although the post-develop defect density and distribution may vary according to the particular mask layout employed. Such post-develop defects may also be interspersed in the open areas between circuit patterns of a logic device structure. FIG. 2 illustrates a plan view of a patterned photoresist clad wafer 26 for such a device. Following development of the photoresist 28, post-develop defects 34 are primarily detected in the open areas 38 around and/or outside of the circuit patterns 30. With respect to logic device structures, it should be appreciated that defect distribution is layout sensitive (logic device layout) while defect density varies with the logic device mask layout as well as the resist process employed.

In accordance with the present invention, one or more factors, such as integration interactions, raw materials influences, and lithography process effects, may be varied in order to effectively reduce or mitigate the effects of such resist residue defects in a semiconductor manufacturing process. For example, the following table illustrates a comparison of a standard process and a modified process, wherein several process parameters have been varied in order to identify the relative effect of such variation on the formation of such circular resist residue defects.

|  | Standard Process | Modified Process |
| --- | --- | --- |
| Mask Layer | Layer 2 | Layer 1 |
| Substrate Material | SiN | SiON |
| Layer 1 resist strip | recipe A | recipe B |
| Plasma surface treatment | recipe I | recipe II |
| Vapor Prime | MP90 | HMDS |
| Developer | No Surfactant | Surfactant |
| Resist | Japanese | U.S. |
| Post Develop Rinse | Normal | Extended |
| Develop RPM | Normal | Reduced |
| Exhaust | Normal | Increased |

Figure 3:
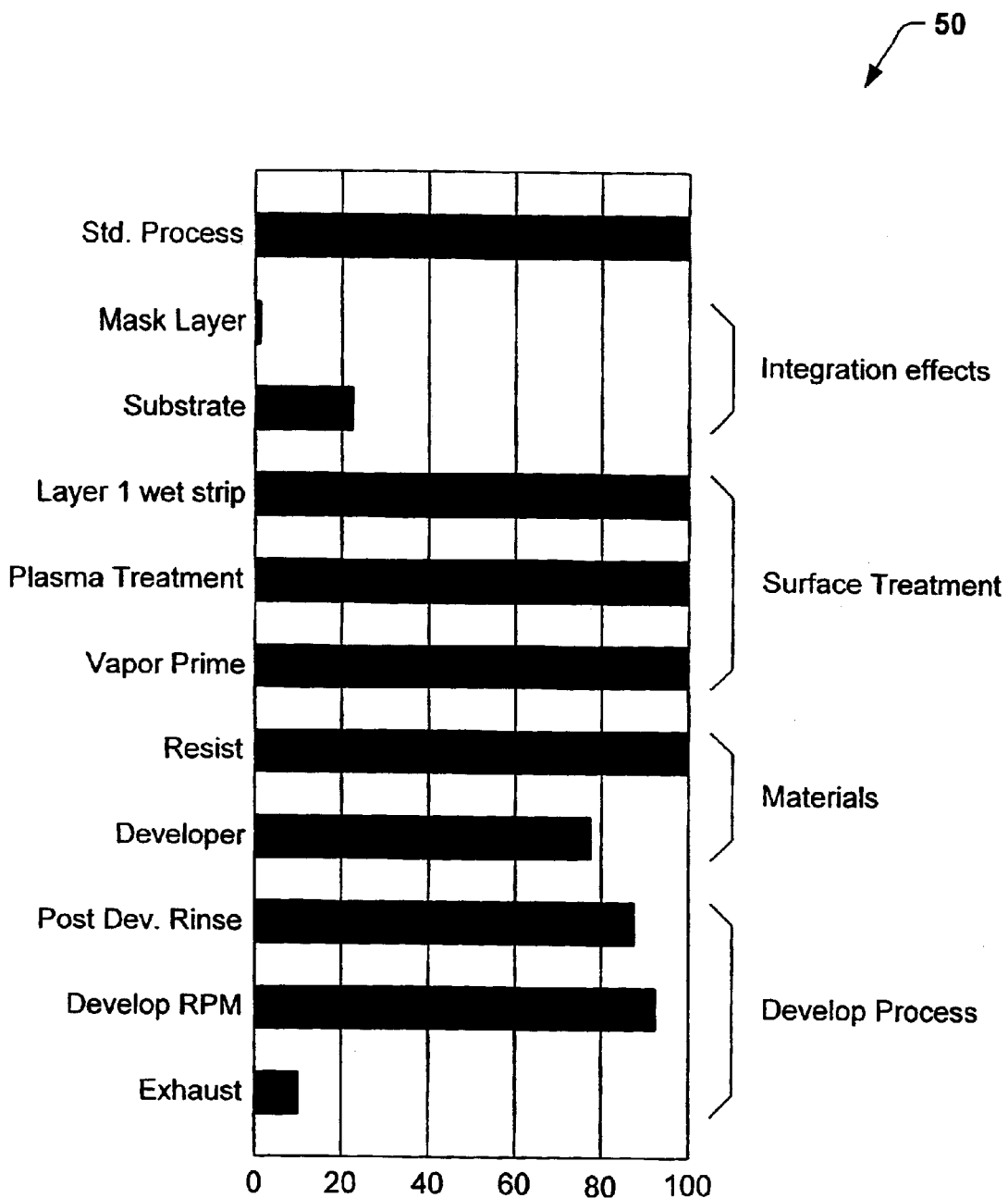
FIG. 3 is a plot of exemplary relative circular defect reduction through variation in several factors in accordance with the invention.

Referring now to FIG. 3, an exemplary plot 50 illustrates the relative effect of varying one or more such process parameters, wherein the effects of integration, surface treatment, materials, and develop process factors are scaled relative to the standard process. In this regard, the defect density of the standard process is normalized to 100, and the others are assigned a value based on the resulting defect density relative to the standard process. From the plot 50, it can be seen that the integration effects, materials, and develop process achieved greater reduction in resist residue defects than did surface treatment parameter variation.

The circular defects have been found in many types of deep ultra-violet (DUV) resists. A DUV resist from a U.S. supplier was substituted for that of a Japanese supplier used in the standard process, with little or no significant reduction in circular defects. However, as illustrated in the plot 50, the use of a developer with a more aggressive surfactant than that employed in the standard process provided for significant defect reduction. The modification of one or more parameters in the develop process also provides significant defect reduction opportunities, in particular the deionized water rinse, develop rotational speed, and the track exhaust level. For instance, the plot 50 illustrates that appropriate increase in the track exhaust provides reduction of over 90% of such circular defects.

Figure 4:
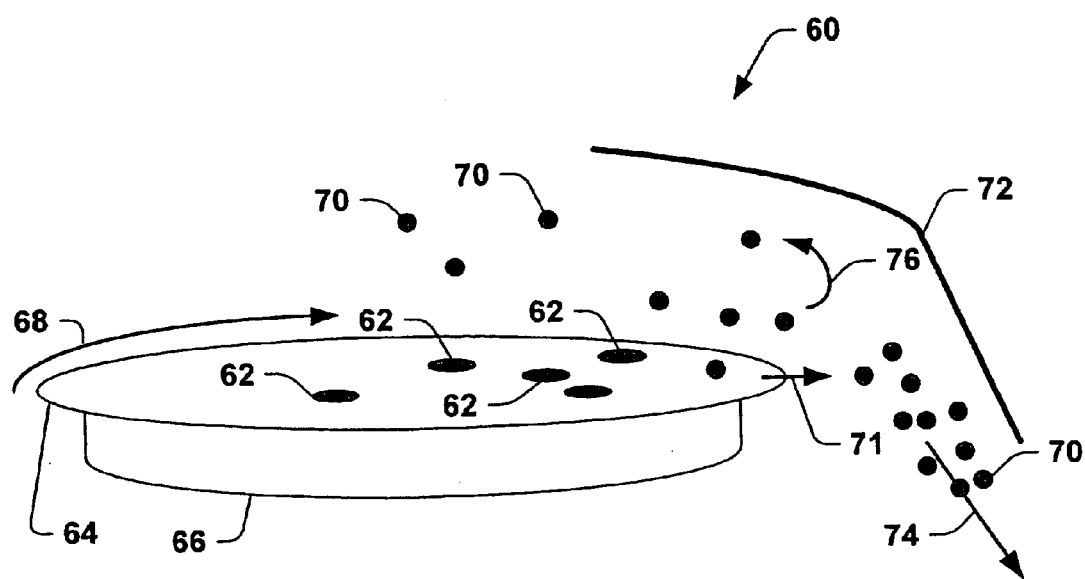
FIG. 4 is a schematic diagram illustrating an exemplary resist residue model of circular defect formation.

Referring also to FIG. 4, an exemplary model 60 illustrates the formation of post develop satellite defects 62 on a wafer 64 as the wafer 64 is rotated on a support 66 in the direction of arrow 68. During a develop process, a mixture of developer solution and resist byproducts forms into droplets 70. As this solution is spun off the wafer at high speeds in the direction of arrow 71, collisions with the developer cup sidewall 72 channel many such droplets 70 away from the wafer in the direction of arrow 74. However, such collisions also result in splashback of a significant number of such droplets 70 in the direction of arrow 76, which in turn form an aerosol above the wafer 64. When the wafer 64 is spun dry, these droplets 70 fall back onto the surface of the wafer 64. If these droplets 62 include impurities (e.g., Ca and S), the defect 62 may become robust enough to withstand decay during etch, and hence prevent or inhibit further processing of the wafer 64, resulting in degraded fidelity of the desired pattern at that layer.

Thus, where a first layer (e.g., layer 1 in the above table) contains a dense pattern wherein less than 15% of the total field is developed away, and wherein a second layer (e.g., layer 2) is sparsely populated with nearly 80% of the total resist removed, the concentration of resist byproducts is more dilute in the fist layer than in the second. As a result, the circular defect level may relate inversely to the pattern density. It has also been found that the density of such circular or satellite defects is lower on SiON substrates than on SiN. This is believed to arise from the tendency of resist to adhere stronger to nitride than to oxide. Consequently, when the droplets 70 land on the wafer 64, they are more difficult to remove from the nitride surface in the. standard process.

In accordance with the invention, a reduction in the develop spin speed mitigates the amount of splashing inside the developer cup, and consequently reduces the droplet formation on the wafer 64. Also, the increase in the cup exhaust has a significant impact on reducing defects, whereby the amount of resist residue or byproducts in the ambient surrounding the wafer 64 is reduced. Alternatively or in combination, such defects may be mitigated through enhancement of the rinsing efficiency on the surface of the wafer 64. For example, the employment of a developer with a more aggressive surfactant may achieve this by reducing the surface tension of the particles 62 and hence their tendency to stick to the surface of the wafer 64. Thus, the invention provides for reduction in the density of such resist residue defects through one or both of reduced generation and/or enhanced removal thereof from the wafer 64, whereby 99% reduction in such circular defects can be achieved.

In accordance with the invention, methods and systems are provided for reducing or mitigating the effects of resist residue defects in a semiconductor manufacturing process. A photoresist coat is applied to a semiconductor substrate structure, and a first portion of the photoresist coat is exposed using an exposure source and a photomask, wherein a second portion of the photoresist is unexposed. The first portion of the photoresist is developed using a developer, after which the developed first portion of the photoresist is removed from the structure, and resist residues are removed from the structure in order to reduce resist residue defects. For example, an anti-reflective coating may be applied to the structure prior to applying the photoresist coat, wherein the anti-reflective coating comprises SiON in order to reduce the tendency of such residues to adhere to the structure and to facilitate removal therefrom. Another technique according to the invention involves exhausting resist residue from the structure at a rate of between about 5 to 6 meters per second air velocity.

Alternatively or in combination, the removal of the developed photoresist may comprise rinsing the structure using a plurality of rinse nozzles selectively applying rinsing fluid to the structure from generally opposite sides thereof Furthermore, the development may comprise applying deionized water to the structure, wherein the deionized water is heated to at least about 40 degrees C. (e.g., 40–45 C. range is preferred). In this regard, the structure can be rinsed with deionized water for extra time of at least about 40 seconds over a standard rinse time (e.g., 20–30 seconds) or at least about 60 seconds total. For instance, the invention provides for spinning the structure at a rotational speed of about 1000 rpm and rinsing the front and back of the structure for about 40 seconds and spinning the structure at a rotational speed of about 600 rpm and rinsing the front and back of the structure for about 8 seconds.

Moreover, the development may employ a developer with a surfactant to facilitate removal of such defects from the wafer surface.

The invention may further provide for modification of processing and/or materials employed in a vapor priming operation. For instance the methodologies of the invention can comprise performing a vapor priming operation of short duration using a mild priming agent prior to applying the photoresist. In this regard, the duration of the vapor priming operation can be in the range of about 5 to 20 seconds, and the priming agent can be an HMDS priming agent, as opposed to MP-90 type employed in standard processes. During such vapor priming, the structure can be held at a temperature in the range of about 85 to 130 degrees C. Alternatively or in combination, the selective exposure of the first portion of the photoresist coat can comprise baking the structure at a post exposure bake (PEB) temperature of at least about 120 degrees C. The method may include other process variations from the standard process, for example, descumming the structure and performing a polysilicon etch operation on the structure, such as including an overetch duration of at least about 30 seconds. The invention further provides systems for performing such techniques.

Figure 5A:
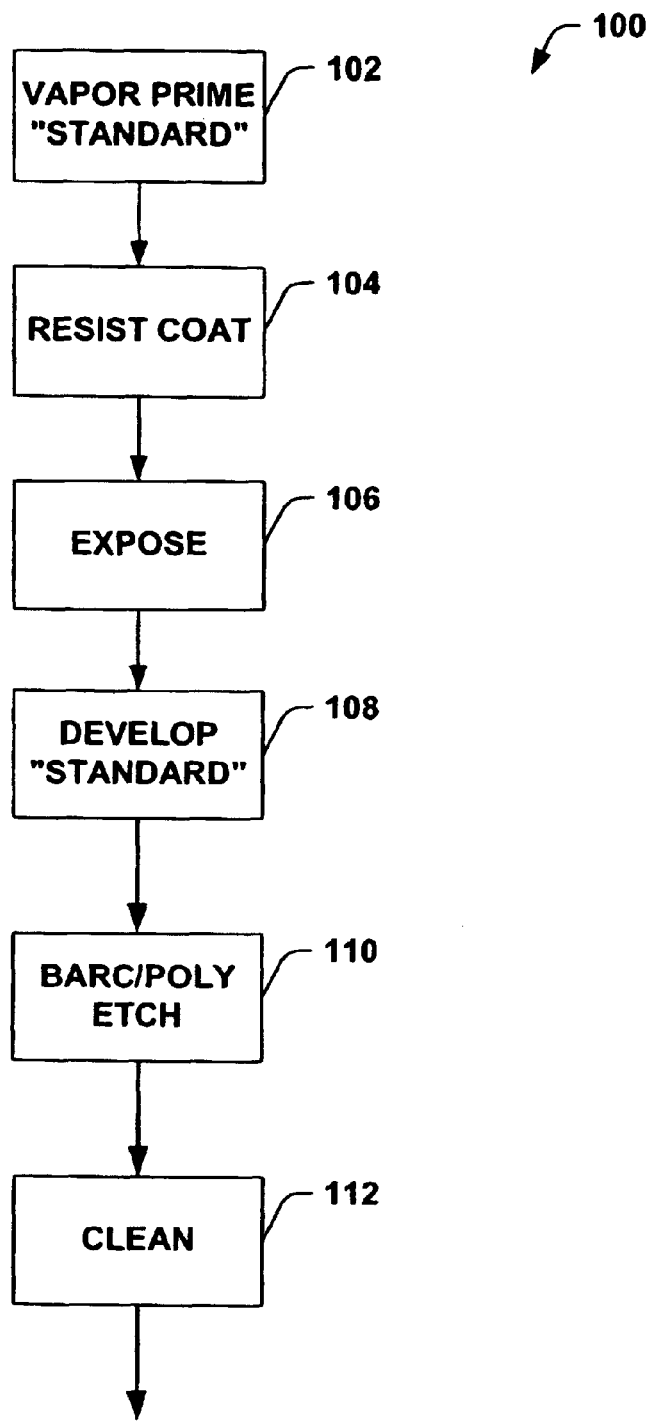
FIGS. 5A and 5B are flow diagrams illustrating a lithographic process employing standard vapor prime and development operations.
Figure 5B:
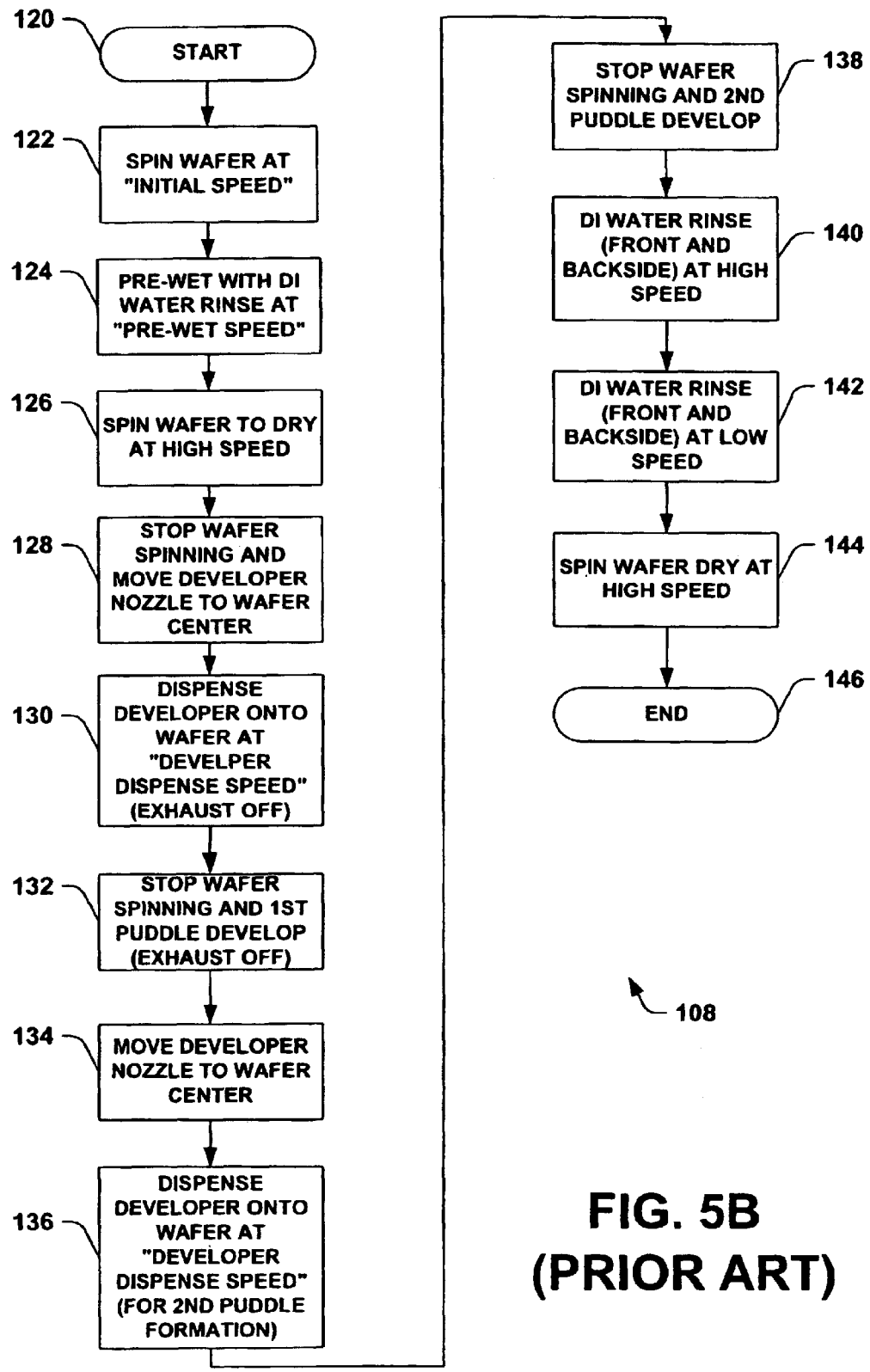

A standard process 100 is illustrated in FIGS. 5A and 5B. A standard vapor prime operation is performed at 102, for example, using an MP-90 type of priming agent, wherein the priming is done in a wide range of temperatures (e.g., 50 to 180 degrees C.), and for a wide range of times (e.g., 5 to 40 seconds). Thereafter, a resist coat is applied at 104, and the wafer is exposed (e.g., through a mask) at 106. A standard development is then performed at 108, as illustrated and described in greater detail hereinafter with respect to FIG. 5B, and a BARC/POLY etch is performed at 110. Thereafter, the wafer is cleaned at 112.

Referring now to FIG. 5B, further details of the standard development operation 108 are illustrated beginning at 120, in which the wafer is spun at 122 at an initial (e.g., rotational) speed, and pre-wetted at 124 with a DI water rinse at a pre-wet speed. The wafer is then spun at a high speed at 126 in order to dry the wafer. At 128, the wafer is stopped, and a developer nozzle is moved to the wafer center. Developer is then dispensed at 130 onto the wafer, which is spun at a developer dispense speed with the exhaust off. The wafer spinning is then stopped at 132 for development of a first puddle, also with the exhaust off, whereafter the developer nozzle is again moved to the wafer center at 134.

At 136, developer is dispensed onto the wafer at a dispense speed for formation of a second puddle, after which the wafer spinning is stopped at 138 for development of a second puddle. It will be appreciated that 134, 136, and 138 may be skipped if the process uses only one puddle. At 140, the front and back sides of the wafer are rinsed using DI water at high rotational speed for a standard rinse time of about 20 seconds, after which the wafer is rinsed at 142 at a low rotational speed for a standard time of about 4 seconds. Thereafter at 144, the wafer is spun dry and the develop operation 108 ends at 146. The standard process 100 of FIGS. 5A and 5B is prone to the above described circular or satellite resist residue defects. Other than 130 and 132, the developer exhaust is maintained at a medium setting (e.g, 2.5 to 3.0 meters per second air velocity). The present invention provides methods and systems by which the adverse effects of such defects can be mitigated.

Figure 6A:
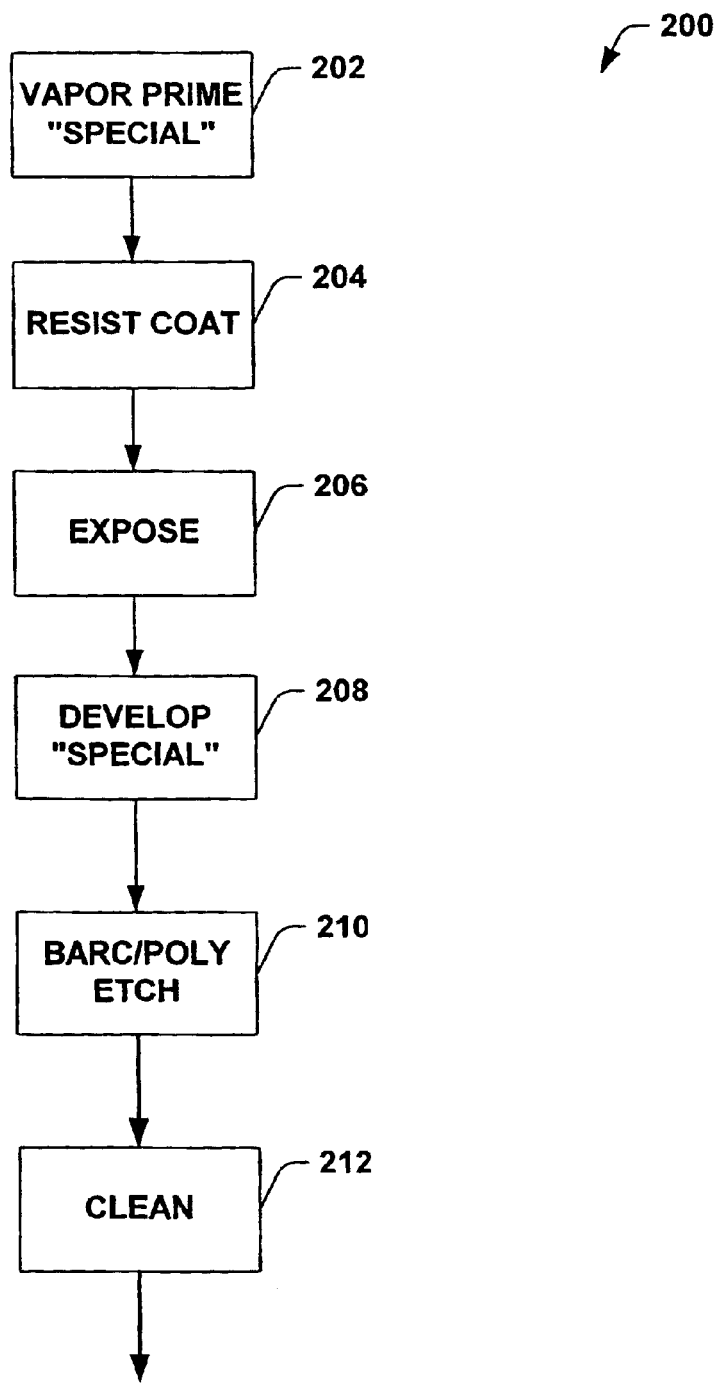
FIGS. 6A and 6B are flow diagrams illustrating an exemplary lithographic process employing vapor prime and development operations in order to reduce resist residue defects in accordance with the present invention.
Figure 6B:
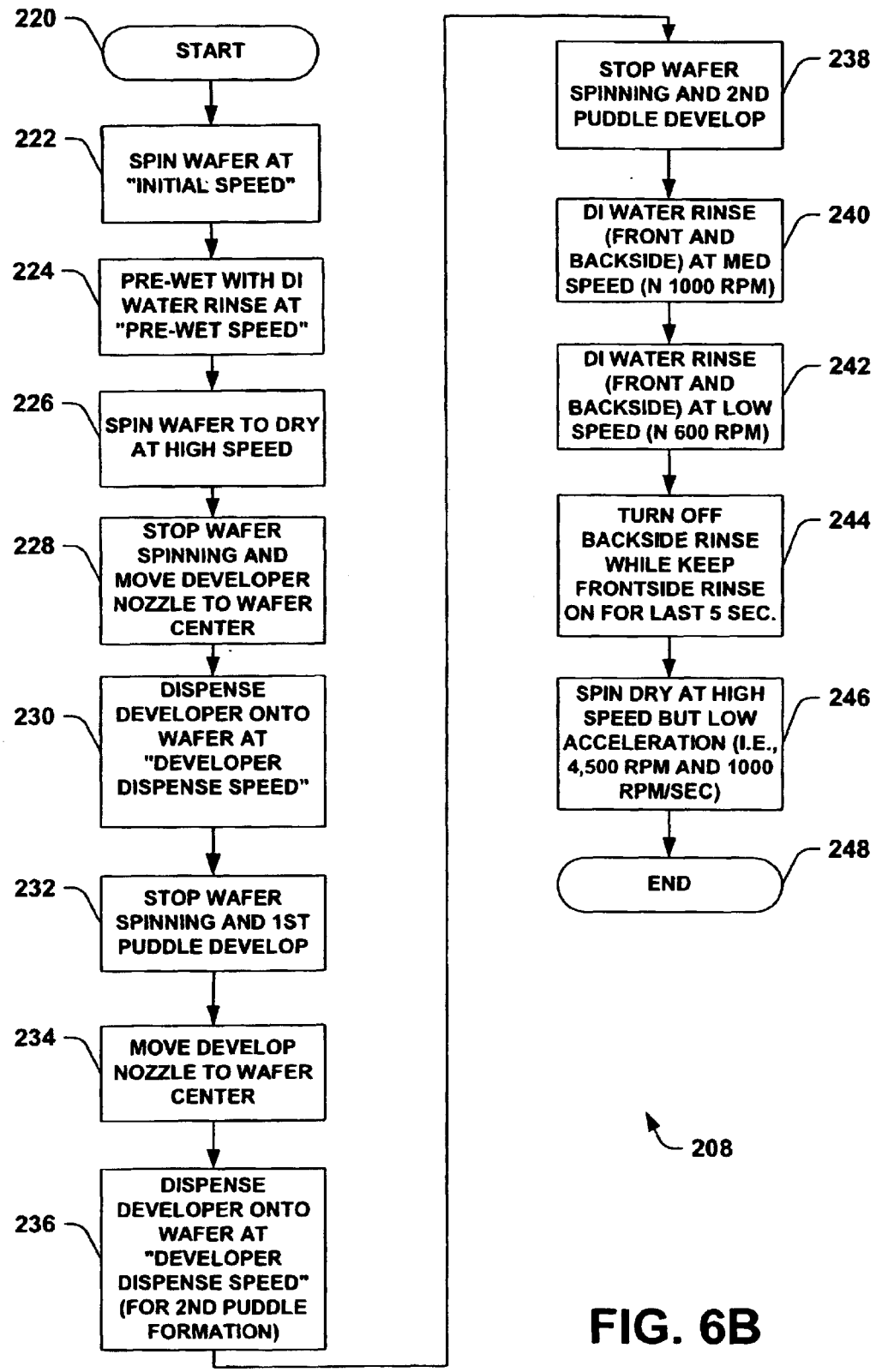

Referring now to FIGS. 6A and 6B, an exemplary lithography process or method 200 is illustrated in accordance with the present invention, which can be employed in order to reduce or mitigate circular defects. The techniques according to the invention may be employed, for example, as part of a semiconductor device manufacturing or fabrication process. Although the exemplary method 200 is illustrated and described herein as a series of blocks representative of various events and/or acts, the present invention is not limited by the illustrated ordering of such blocks. For instance, some acts or events can occur in different orders and/or concurrently with other acts or events; apart from the ordering illustrated herein, in accordance with the invention. Moreover, not all illustrated blocks, events, or acts, may be required to implement a methodology in accordance with the present invention. In addition, it will be appreciated that the exemplary method 200 and other methods according to the invention can be implemented in association with the apparatus and systems illustrated and described herein, as well as in association with other systems and apparatus not illustrated or described.

A special vapor prime operation is performed at 202, using an HMDS type priming agent, wherein the priming is done at a low range of temperatures (e.g., 85 to 130 degrees C.), and for a relatively short time (e.g., 5 to 20 seconds), wherein the short priming time can be made to be within the equipment tolerance. Thereafter, a resist coat is applied at 204, and the wafer is exposed (e.g., through a photomask) at 206. A special or modified development operation is then performed at 208, as illustrated and described in greater detail hereinafter with respect to FIG. 6B, and a BARC/POLY etch is performed at 210. Thereafter, the wafer is cleaned at 212.

Referring now to FIG. 6B, further details of the standard development operation 208 are illustrated beginning at 220, in which the wafer is spun at 222 at an initial (e.g., rotational) speed, and pre-wetted at 224 with a DI water rinse at a pre-wet speed. The wafer is then spun at a high speed at 226 in order to dry the wafer. At 228, the wafer is stopped, and a developer nozzle is moved to the wafer center. Developer is then dispensed at 230 onto the wafer, which is spun at a developer dispense speed. Throughout the special develop operation 208, a high exhaust setting is used, for example, in which the exhaust air velocity is maintained at between about 5 and 6 meters per second. The wafer spinning is then stopped at 232 for development of a first puddle, whereafter the developer nozzle is again moved to the wafer center at 234.

At 236, developer is dispensed onto the wafer at a dispense speed for formation of a second puddle, after which the wafer spinning is stopped at 238 for development of a second puddle. It will be appreciated that 234, 236, and 238 may be skipped if the process uses only one puddle. At 240, the front and back sides of the wafer are rinsed using DI water at a medium rotational speed of about 1000 rpm for an extended rinse time of at least about 40 seconds. Thereafter, the wafer is rinsed at 242 at a rotational speed of about 600 rpm for an extended rinse time of about 8 seconds. Thereafter at 244, the backside rinse is stopped, while the frontside rinse is continued for about 5 seconds. The wafer is then spun dry at 246 at a high speed (e.g., about 4500 rpm) with a low acceleration (e.g., about 1000 rpm per second). Thereafter, the special develop operation 208 ends at 248.

The exemplary method 200 thus facilitates significant reduction in resist residue defects illustrated and described above through the incorporation of various process and/or material modifications to a standard process. It will be appreciated, however, that the invention contemplates employment of any such modifications, alone or in combination, in order to provide for mitigation of the effects of such defects in a semiconductor manufacturing process.

For example, an anti-reflective coating may be applied to the structure prior to applying the photoresist coat at 204, wherein the anti-reflective coating comprises SiON in order to reduce the tendency of such residues to adhere to the structure and to facilitate removal therefrom. Alternatively or in combination, the removal of the developed photoresist may comprise rinsing the structure using a plurality of rinse nozzles (e.g., at 240, 242) selectively applying rinsing fluid to the structure from generally opposite sides thereof Furthermore, the development 208 may comprise applying deionized rinse water to the structure (e.g., at 240, 242, and/or 244), using deionized water at a temperature of at least about 40 degrees C. In this regard, the structure can be rinsed with deionized water for at least about 40 seconds extra over a standard rinse time (e.g., 20–30 sec). Moreover, the development may employ a developer at 230 with a surfactant to facilitate removal of such defects from the wafer surface.

The invention may further provide for modification of processing and/or materials employed in the vapor priming operation at 202. For instance the methodologies of the invention can comprise performing a vapor priming operation of short duration using a mild priming agent prior to applying the photoresist. In this regard, the duration of the vapor priming operation can be in the range of about 5 to 20 seconds, and the priming agent can be an HMDS priming agent, as opposed to MP-90 type employed in standard processes (e.g., process 100). During such vapor priming, the structure can be held at a temperature in the range of about 85 to 130 degrees C., as opposed to 50 to 180 degrees C. used in the standard process. Alternatively or in combination, the selective exposure at 206 of the photoresist coat can comprise baking the structure at a post exposure bake (PEB) temperature of at least about 120 degrees C. The method 200 and other methods in accordance with the invention may employ other process variations, along or in combination, from the standard process, for example, descumming the structure and performing a polysilicon etch operation on the structure at 210, such as including an overetch duration of at least about 30 seconds.

Figure 7A:
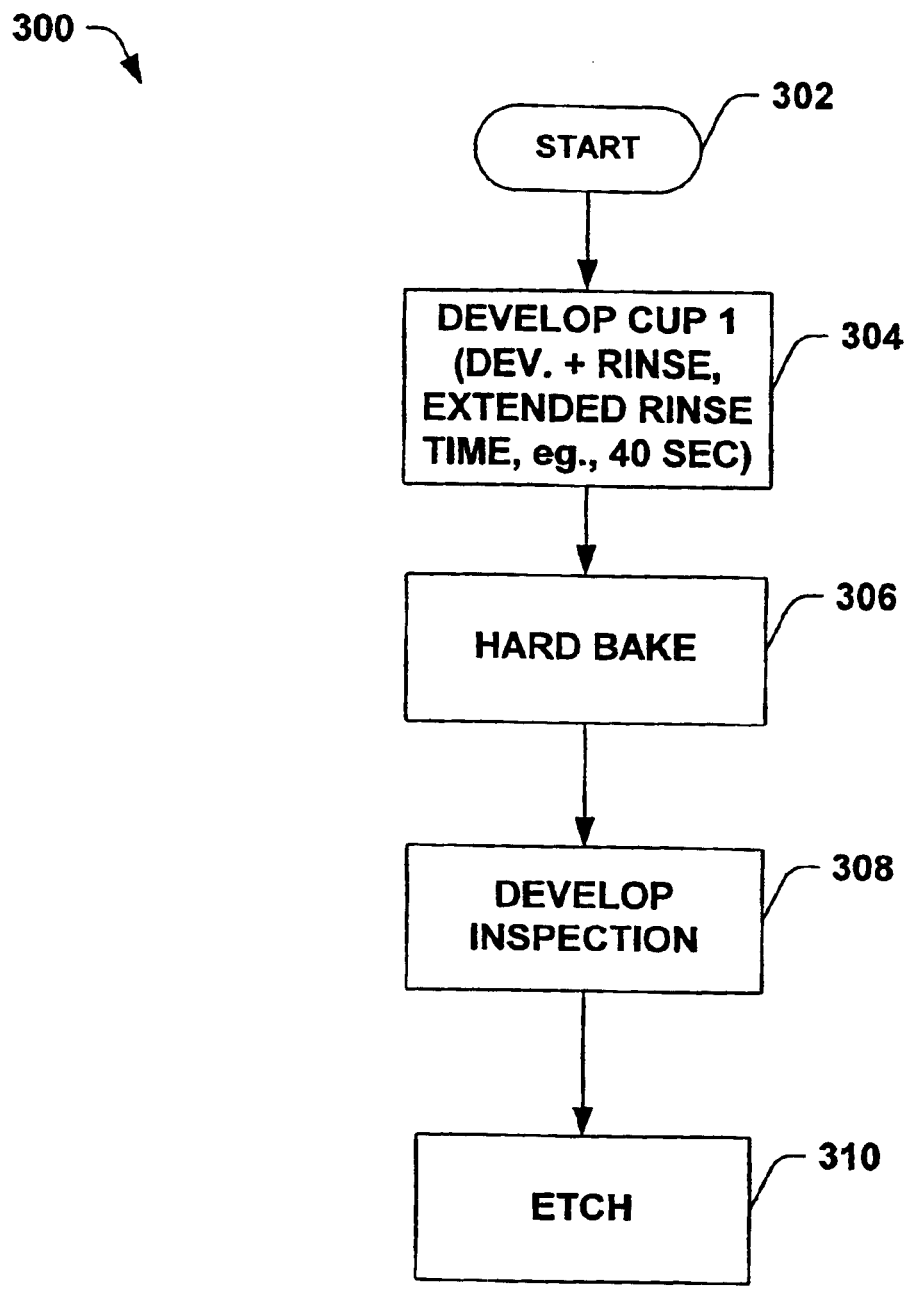
FIG. 7A is a flow diagram illustrating an exemplary single cup development operation in accordance with another aspect of the invention.

Referring now to FIG. 7A, an exemplary method 300 is illustrated for performing a develop operation in accordance with another aspect of the invention. Although the exemplary method 300 is illustrated and described herein as a series of blocks representative of various events and/or acts, the present invention is not limited by the illustrated ordering of such blocks. For instance, some acts or events can occur in different orders and/or concurrently with other acts or events, apart from the ordering illustrated herein, in accordance with the invention. Moreover, not all illustrated blocks, events, or acts, may be required to implement a methodology in accordance with the present invention. In addition, it will be appreciated that the exemplary method 300 and other methods according to the invention can be implemented in association with the apparatus and systems illustrated and described herein, as well as in association with other systems and apparatus not illustrated or described. Beginning at 302, the method 300 comprises using a single develop cup, and may be employed, for example, where process throughput is not critical. At 304, the develop and rinse of a wafer is performed using an extended rinse time (e.g., about 40 seconds), and a hard bake operation is performed at 306. A develop inspection is then performed at 308 and an etch operation is done at 310.

Figure 7B:
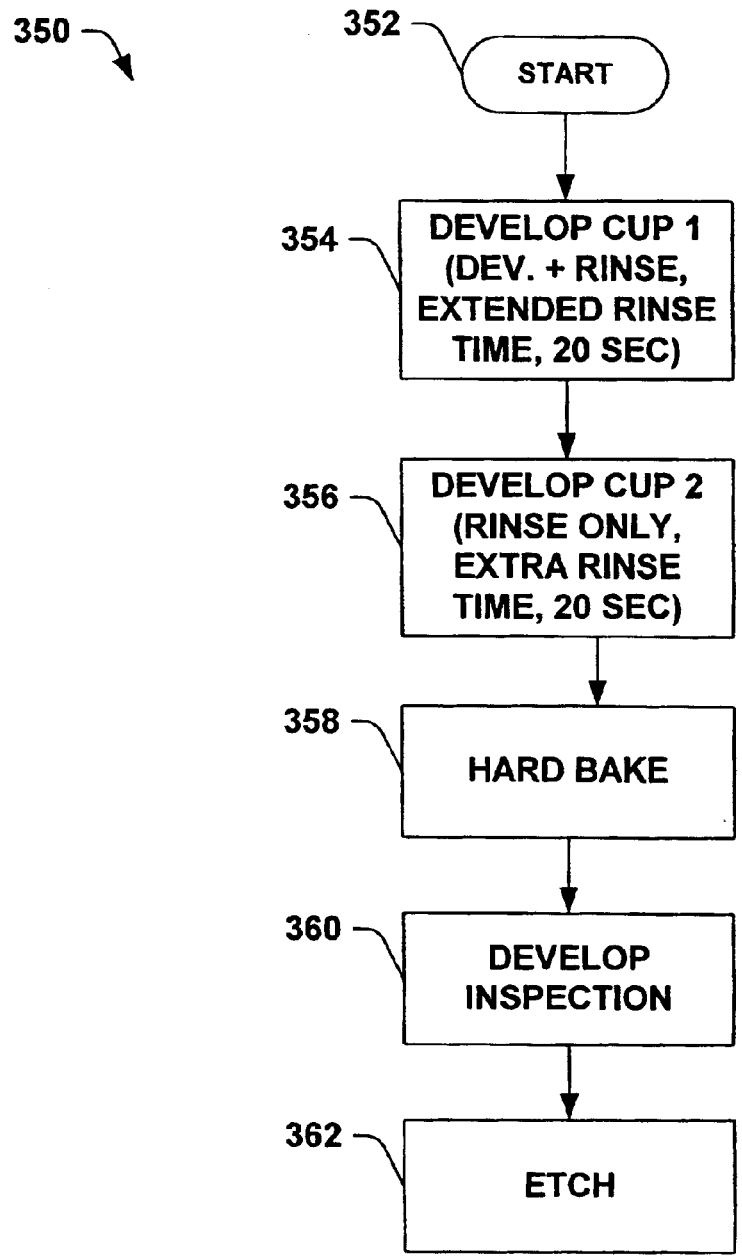
FIG. 7B is a flow diagram illustrating an exemplary dual cup development operation in accordance with another aspect of the invention.

Referring also to FIG. 7B, another exemplary develop method 350 is illustrated beginning at 352. The method 350 employs two cups, and may be advantageously employed in order to further enhance process throughput. Although the exemplary method 350 is illustrated and described herein as a series of blocks representative of various events and/or acts, the present invention is not limited by the illustrated ordering of such blocks. For instance, some acts or events can occur in different orders and/or concurrently with other acts or events, apart from the ordering illustrated herein, in accordance with the invention. Moreover, not all illustrated blocks, events, or acts, may be required to implement a methodology in accordance with the present invention. In addition, it will be appreciated that the exemplary method 350 and other methods according to the invention can be implemented in association with the apparatus and systems illustrated and described herein, as well as in association with other systems and apparatus not illustrated or described. At 354, develop and rinse operations are performed using an extended rinse time of about 20 seconds. Thereafter at 356, an additional rinse operation is performed in a second develop cup, for example, using an extra rinse time of about 20 seconds. At 358, a hard bake is performed and a develop inspection is done at 360, whereafter an etch operation is performed at 362.

Although the invention has been shown and described with respect to certain implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary applications and implementations of the invention.

In addition, while a particular feature of the invention may have been disclosed with respect to only one of several aspects or implementations of the invention, such a feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising" and its variants.

What is claimed is:

1. A method of reducing resist residue defects in a semiconductor manufacturing process, comprising:

performing a special vapor prime operation to a semiconductor substrate structure, wherein the special vapor prime operation comprises using a hexamethyldisilazane priming agent and is performed at a temperature between about 85 degrees C. and 130 degrees C. for a period of between about 5 seconds and about 20 seconds;

applying a photoresist coat to the semiconductor substrate structure;

selectively exposing a first portion of the photoresist coat using an exposure source and a photomask, wherein a second portion of the photoresist is unexposed;

performing a special development operation on the first portion of the photoresist using a developer and maintaining an exhaust air velocity from about 5 meters per second or more to about 6 meters per second or less;

removing the developed first portion of the photoresist from the structure; and removing resist residues from the structure in order to reduce resist residue defects.

2. The method of claim 1, wherein performing the special development operation comprises:
dispensing developer onto the semiconductor substrate structure;
rinsing front and back sides of the semiconductor substrate structure while spinning the semiconductor substrate structure at a medium speed for a first time period;
rinsing the front and back sides of the semiconductor substrate structure while spinning the semiconductor substate structure at a low speed for a second time period;
rinsing the front side of the semiconductor substrate structure for a third time period; and
drying the semiconductor substrate structure while spinning the semiconductor substrate structure at a high speed.

3. The method of claim 2, wherein rinsing front and back sides of the semiconductor substrate structure while spinning the semiconductor substrate structure at a medium speed for a first time period comprises rinsing front and back sides of the semiconductor substrate structure while spinning the semiconductor substrate structure at a speed of about 1000 RPM for a first time period of about 40 seconds.

4. The method of claim 2, wherein rinsing the front and back sides of the semiconductor substrate structure while spinning the semiconductor substrate Structure at a low speed for a second time period comprises rinsing the front and back sides of the semiconductor substrate structure while spinning the semiconductor substrate structure at a speed of about 600 RPM for a second time period of about 8 seconds.

5. The method of claim 2, wherein rinsing the front side of the semiconductor substrate structure for a third time period comprises rinsing the front side of the semiconductor substrate structure for a third time period of about 5 seconds.

6. The method of claim 2, wherein drying the semiconductor substrate structure while spinning the semiconductor substrate structure at a high speed comprises drying the semiconductor substrate structure while spinning the semiconductor substrate structure at a low acceleration of about 1000 RPM per second from rest to a speed of about 4500 RPM.

7. The method of claim 6, wherein rinsing front and back sides of the semiconductor substrate structure while spinning the semiconductor substrate structure at a medium speed for a first time period comprises rinsing front and back sides of the semiconductor substrate structure while spinning the semiconductor substrate structure at a speed of about 1000 RPM for a first time period of about 40 seconds, wherein rinsing the front and back sides of the semiconductor substrate structure while spinning the semiconductor substrate structure at a low speed for a second time period comprises rinsing the front and back sides of the semiconductor substrate structure while spinning the semiconductor substrate structure at a speed of about 600 RPM for a second time period of about 8 seconds, and wherein rinsing the front side of the semiconductor substrate structure for a third time period comprises rinsing the front side of the semiconductor substrate structure for a third time period of about 5 seconds.

8. The method of claim 1, wherein performing the special development operation comprises:
dispensing developer onto the semiconductor substrate structure;
rinsing front and back sides of the semiconductor substrate structure while spinning the semiconductor substrate structure at a medium speed for a first time period;
rinsing the front and back sides of the semiconductor substrate structure while spinning the semiconductor substrate structure at a low speed for a second time period;
rinsing the front side of the semiconductor substrate structure for a third time period; and
drying the semiconductor substrate structure while spinning the semiconductor substrate structure at a high speed.

9. The method of claim 8, wherein spinning front and back sides of the semiconductor substrate structure while spinning the semiconductor substrate structure at a medium speed for a first time period comprises rinsing front and back sides of the semiconductor substrate structure while spinning the semiconductor substrate structure at a speed of about 1000 RPM for a first time period of about 40 seconds.

10. The era of claim 8, wherein rinsing the front and back sides of the semiconductor substrate structure while spinning the semiconductor substrate structure at a low speed for a second time period comprises rinsing the front and back sides of the semiconductor substrate structure while spinning the semiconductor substrate structure at a speed of about 600 RPM for a second time period of about 8 seconds.

11. The method of claim 8, wherein rinsing the front side of the semiconductor substrate structure for a third time period comprises rinsing the front side of the semiconductor substrate structure for a third time period of about 5 seconds.

12. The method of claim 8, wherein drying the semiconductor substrate structure while spinning the semiconductor substrate structure at a high speed comprises drying the semiconductor substrate structure while spinning the semiconductor substrate structure at a low acceleration of about 1000 RPM per second from rest to a speed of about 4500 RPM.

13. The method of claim 12, wherein rinsing front and back sides of the semiconductor substrate structure while spinning the semiconductor substrate structure at a medium speed for a first time period comprises rinsing front and back sides of the semiconductor substrate structure while spinning the semiconductor substrate structure at a speed of about 1000 RPM for a first time period of about 40 seconds, wherein rinsing the front and back sides of the semiconductor substrate structure while spinning the semiconductor substrate structure at a low speed for a second time period comprises rinsing the front and back sides of the semiconductor substrate structure while spinning the semiconductor substrate structure at a speed of about 600 RPM for a second time period of about 8 seconds, and wherein rinsing the front side of the semiconductor substrate structure for a third time period comprises rinsing the front side of the semiconductor substrate structure for a third time period of about 5 seconds.

14. A vapor prime operation for a semiconductor manufacturing process, comprising:
priming a semiconductor structure using a hexamethyldisilizane priming agent at a temperature from about 85 degrees C. or more to about 130 degrees C. or less for a time period from about 5 seconds or more to about 20 seconds or less;
applying a photoresist coat to the semiconductor substrate structure;
selectively exposing a first portion of the photoresist coat using an exposure source and a photomask, wherein a second portion of the photoresist is unexposed; and
performing a special development operation on the first portion of the photoresist using a developer and maintaining an exhaust air velocity from about 5 meters per second or more to about 6 meters per second or less.

* * * * *

UNITED STATES PATENT AND TRADEMARK OFFICE
CERTIFICATE OF CORRECTION

PATENT NO. : 6,759,179 B1
DATED : July 6, 2004
INVENTOR(S) : Khoi A. Phan et al.

It is certified that error appears in the above-identified patent and that said Letters Patent is hereby corrected as shown below:

Column 1,
Line 66, please change "modem" -- modern --.

Column 4,
Line 39, please change "DLV" to -- DUV --.

Column 5,
Line 67, please change "fist" to -- first --.

Column 11,
Line 13, please change "substate" to -- substrate --.

Column 12,
Line 10, please change "spinning" to -- rinsing --.
Line 17, please change "era" to -- method --.

Signed and Sealed this

Seventh Day of June, 2005

JON W. DUDAS
*Director of the United States Patent and Trademark Office*